(12) United States Patent
Dutta et al.

(10) Patent No.: US 12,183,630 B2
(45) Date of Patent: Dec. 31, 2024

(54) ADDITIVE INTERCONNECT FORMATION

(71) Applicant: International Business Machines Corporation, Armonk, NY (US)

(72) Inventors: Ashim Dutta, Clifton Park, NY (US); Ekmini Anuja De Silva, Slingerlands, NY (US); Chih-Chao Yang, Glenmont, NY (US); Jennifer Church, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 17/691,085

(22) Filed: Mar. 9, 2022

(65) Prior Publication Data
US 2023/0290682 A1 Sep. 14, 2023

(51) Int. Cl.
H01L 21/768 (2006.01)
H01L 23/528 (2006.01)
H01L 23/532 (2006.01)

(52) U.S. Cl.
CPC .. *H01L 21/76879* (2013.01); *H01L 21/76865* (2013.01); *H01L 23/5283* (2013.01); *H01L 21/76801* (2013.01); *H01L 21/76843* (2013.01); *H01L 23/53209* (2013.01); *H01L 23/53266* (2013.01)

(58) Field of Classification Search
CPC ......... H01L 21/76879; H01L 21/76865; H01L 21/76801; H01L 21/76843; H01L 21/76897; H01L 21/76885; H01L 23/53266; H01L 21/76816; H01L 21/76834
See application file for complete search history.

(56) References Cited

U.S. PATENT DOCUMENTS

| 5,674,787 | A | 10/1997 | Zhao | |
| 5,977,638 | A * | 11/1999 | Rodgers | H01L 23/528 |
| | | | | 257/E21.582 |
| 6,211,085 | B1 | 4/2001 | Liu | |
| 6,632,741 | B1 * | 10/2003 | Clevenger | H01L 21/0334 |
| | | | | 438/689 |
| 6,893,957 | B2 | 5/2005 | Trivedi | |
| 9,478,462 | B1 | 10/2016 | Wang | |
| 9,773,676 | B2 | 9/2017 | Chang et al. | |
| 9,895,715 | B2 | 2/2018 | Haukka | |
| 9,953,916 | B2 | 4/2018 | Chen | |
| 10,177,028 | B1 | 1/2019 | Licausi | |
| 10,395,986 | B1 | 8/2019 | Briggs | |
| 2007/0207604 | A1 * | 9/2007 | Furukawa | H01L 21/76874 |
| | | | | 257/E23.152 |

(Continued)

*Primary Examiner* — Julia Slutsker
(74) *Attorney, Agent, or Firm* — L. Jeffrey Kelly; Otterstedt & Kammer PLLC

(57) ABSTRACT

A semiconductor substrate has a metal via in the substrate, and has, on the substrate, a metal line that is less than 8 nanometers (nm) wide and at least 20 nm tall. A method for making a semiconductor structure includes forming a metal via in a substrate; forming a mandrel atop and offset from the via; depositing a metal-containing liner onto the mandrel; exposing the top of the mandrel by anisotropically etching the liner, thereby defining a separate portion of the liner at each side of the mandrel; and growing a metal line on each portion of the liner.

20 Claims, 3 Drawing Sheets

(56) References Cited

U.S. PATENT DOCUMENTS

| | | | |
|---|---|---|---|
| 2013/0207270 A1* | 8/2013 | Holmes | H01L 23/485 |
| | | | 257/E21.59 |
| 2015/0364413 A1* | 12/2015 | Peng | H01L 23/5226 |
| | | | 438/666 |
| 2018/0358260 A1* | 12/2018 | Roy | H01L 21/76801 |
| 2019/0318968 A1 | 10/2019 | Seo | |
| 2023/0067555 A1* | 3/2023 | Sato | H01L 23/53209 |
| 2023/0207459 A1* | 6/2023 | Ahmed | H01L 23/5283 |
| | | | 257/751 |

\* cited by examiner

ADDITIVE INTERCONNECT FORMATION

BACKGROUND

The present invention relates to the electrical, electronic, and computer arts, and more specifically, to fabrication of integrated circuits.

In making integrated circuits at modern process nodes, i.e., component pitches less than 20 nm, it becomes difficult to pattern and form the metal lines using lithography and etch processes. The difficulty arises from the use of photolithographic subtractive manufacturing at scales less than the wavelength of the light being used to pattern the photoresists. Although double and quadruple patterning has been somewhat effective for reducing feature sizes, metal lines with critical dimension less than 8 nm cannot be formed without line bridges, breaks and flop overs.

An additional problem is that, when working with modern feature sizes, edge roughness of the interconnect lines can reduce their electrical performance. For example, line width roughness in excess of 1 nm, as produced by conventional subtractive processes, can have a very significant impact on the conductivity of a metal line at sub-8 nm line width, e.g., 7 nm or less. Line edge roughness for lines below 8 nm width also increases chances of shorts between adjacent lines. Subtractive processes, such as lithography and reactive ion etching, tend to produce relatively large values for line edge roughness.

SUMMARY

Principles of the invention provide techniques for additive interconnect formation. In one aspect, an exemplary structure includes a semiconductor substrate; a metal via in the substrate; and, on the substrate, a metal line that is less than 8 nanometers (nm) wide and at least 20 nm tall.

According to another aspect, an exemplary method for making a semiconductor structure includes forming a metal via in a substrate; forming a mandrel atop and offset from the via; depositing a metal-containing liner onto the mandrel; exposing the top of the mandrel by anisotropically etching the liner, thereby defining a separate portion of the liner at each side of the mandrel; and growing a metal line on each portion of the liner.

In view of the foregoing, techniques of the present invention can provide substantial beneficial technical effects. For example, one or more embodiments provide one or more of:

Metal lines with width less than 8 nm are reliably formed without line breaks, shorts or flop over.

Metal lines that have reduced line edge roughness, by comparison to lines formed by subtractive processes. Since in this invention metal lines are formed using deposition process without needing etching of very thin lines, line edge roughness reduces significantly. In one or more embodiments, less than 1 nm line edge roughness is achieved on at least one side surface of a line.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

DETAILED DESCRIPTION

As mentioned, a current problem in semiconductor device fabrication is that, when forming metal lines with feature sizes smaller than about 8 nm, it is difficult to avoid line open and shorts. The difficulty arises at least in part because a conventional subtractive fabrication process, i.e., EUV lithography, has a very small process window of patterning photoresist lines at sub-30 nm pitch without line bridges and breaks. In addition, it is very difficult to use any conventional patterning mask material for making sub-8 nm lines without line breaks, shorts, and/or line flop-over. Therefore, metal lines cannot be formed using lithography and etch processes when metal line width is less than 8 nm. For example, conventional processes cannot form metal lines with line width roughness less than 1 nm, and typically, line width roughness from conventional processes is large enough to produce breaks in lines less than 10 nm wide.

An advantage of one or more embodiments of the invention is an additive fabrication process, in which metal lines are formed using deposition process where the width of a metal line can be precisely controlled by deposition thickness. No subtractive process is needed to form metal lines. Therefore, very thin metal lines (width <8 nm) can be formed without line flop over.

Figure 1:
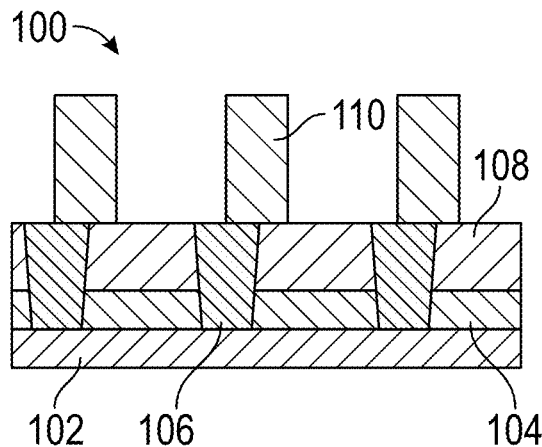
FIG. 1 depicts a schematic of a precursor structure including a substrate, dielectric, vias, and mandrels, according to exemplary embodiments.

A precursor structure 100, as shown in FIG. 1, comprises a substrate 102, a cap dielectric layer 104, a plurality of vias 106, an interlayer dielectric 108, and mandrels 110. In one or more embodiments, the mandrels 110 are at least 20 nm tall. The substrate can contain semiconductor devices and/or plurality of interconnect layer connecting to underlying semiconductor devices. The cap layer 104 is typically used if via 106 is landing on another metal interconnect layer underneath. The cap layer 104 can be formed from, e.g., silicon carbide, silicon carbonitride, silicon nitride, hydrogen-doped silicon compounds, or other conventional dielectric materials. The vias 106 are metal, sometimes copper, sometimes a refractory metal such as ruthenium, cobalt, or tungsten. The interlayer dielectric 108 typically is a low-k dielectric, e.g., carbon and hydrogen doped silicon oxide (SiCOH). The mandrels 110 can be a sacrificial dielectric material, e.g., SiN, SiON, SiOx, SiC etc.

Figure 2:
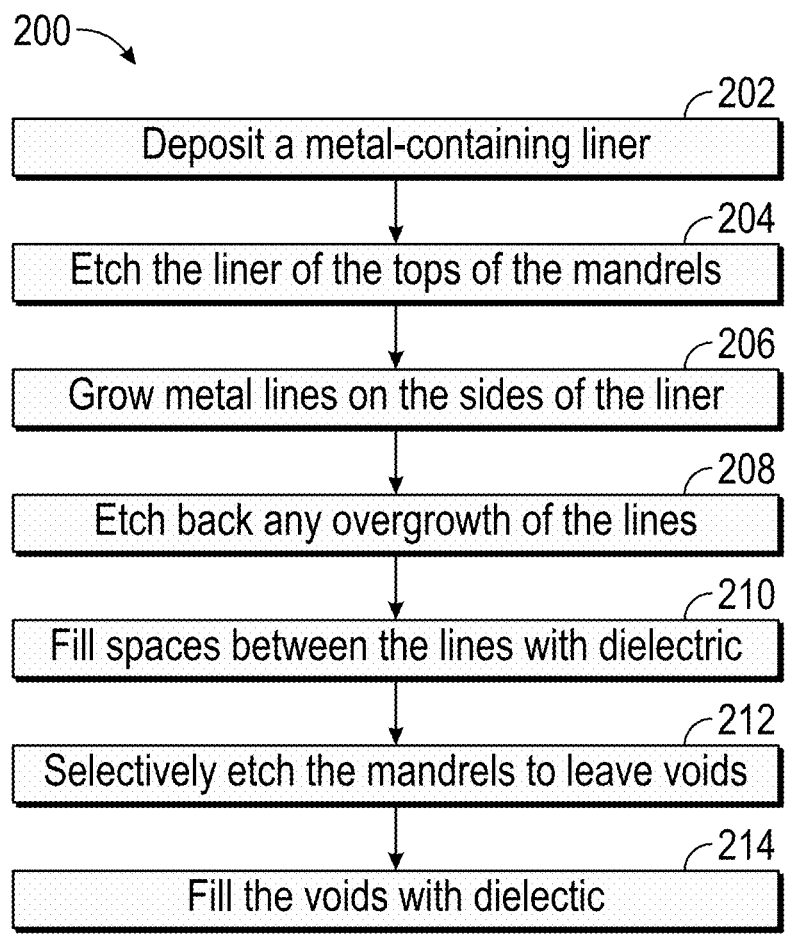
FIG. 2 depicts a flow chart of steps of a process for forming fully-aligned lines with low line edge roughness, according to exemplary embodiments.

Referring to FIG. 2, the precursor structure 100 is worked on according to a process 200 in order to form subsequent structures 700 or 900 (shown in FIG. 7 or FIG. 9, respectively) that include metal lines 502, which are less than 7 nanometers thick and have line edge roughness less than 1 nm on at least one side surface.

Figure 3:
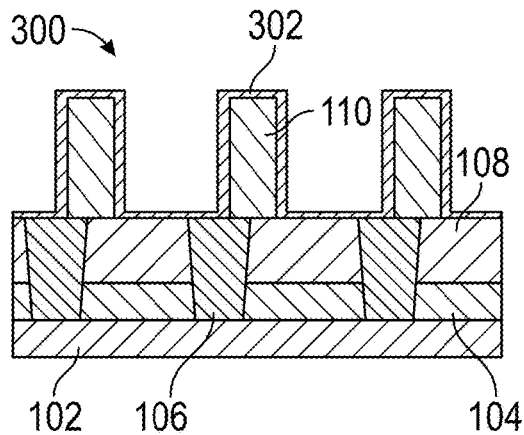
FIG. 3 through FIG. 7 depict structures formed according to steps of the method shown in FIG. 2, according to exemplary embodiments.

At 202, form a structure 300 by depositing a metal-containing liner 302, as shown in FIG. 3. The deposition can be done by various methods. In one or more embodiments, atomic layer deposition or plasma induced atomic layer deposition, is used. Various compositions are suitable for the liner 302. In one or more embodiments, a refractory substance such as titanium nitride, tantalum nitride, or ruthenium is used.

Figure 4:
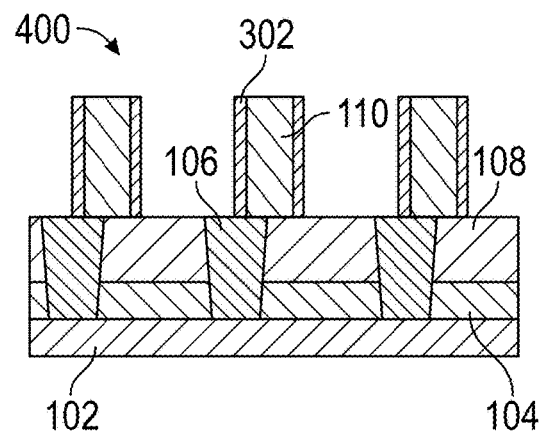

At 204, form a structure 400 by etching the liner off the tops of the mandrels using anisotropic reactive ion etching (RIE) process, as shown in FIG. 4.

Figure 5:
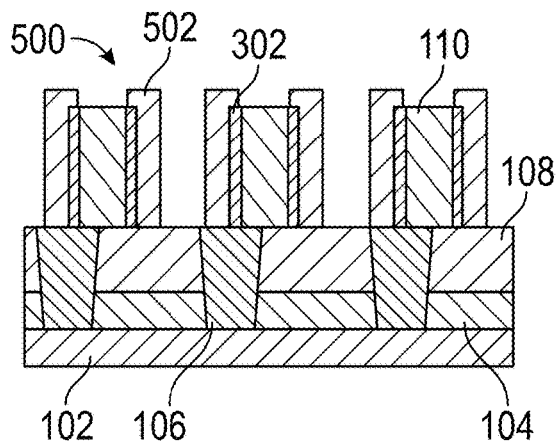

At 206, form a structure 500 by selectively growing metal lines 502 on the sides of the liner, as shown in FIG. 5. The lines can be grown by various selective deposition methods. In one or more embodiments, selective atomic layer deposition is used. In one or more embodiments, the lines grow epitaxially. Various compositions are suitable for the lines 502. In one or more embodiments, a refractory metal such as ruthenium, cobalt, or tungsten is used.

Figure 6:
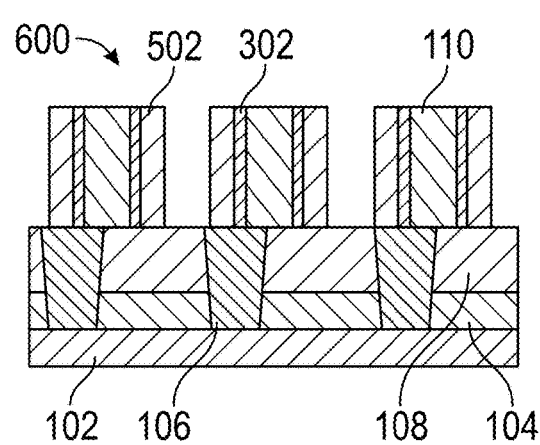

At 208, form a structure 600 by etching back any overgrowth of the metal lines 502 onto the tops of the mandrels 110 using RIE process, as shown in FIG. 6.

Figure 7:
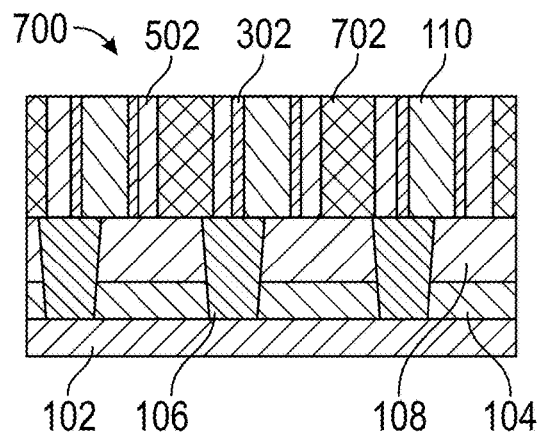

At 210, form a structure 700 by filling spaces between the lines 502 with dielectric 702, as shown in FIG. 7. In one or more embodiments, a low-k dielectric is used.

Figure 8:
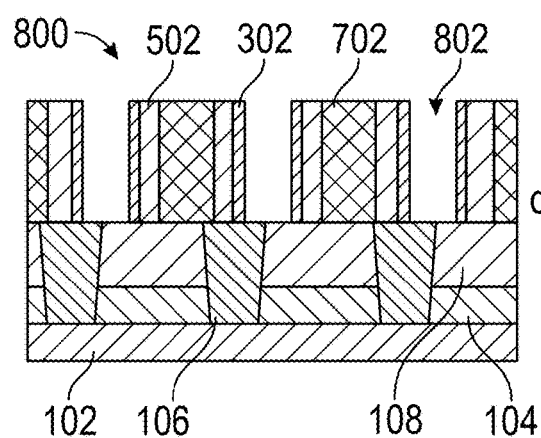
FIG. 8 and FIG. 9 depict structures formed according to optional steps of the method shown in FIG. 2, according to selected exemplary embodiments.

Optionally, when the mandrels 110 comprise a sacrificial semiconductor, then at 212, form a structure 800 by selectively etching the mandrels to leave voids 802, as shown in FIG. 8.

Figure 9:
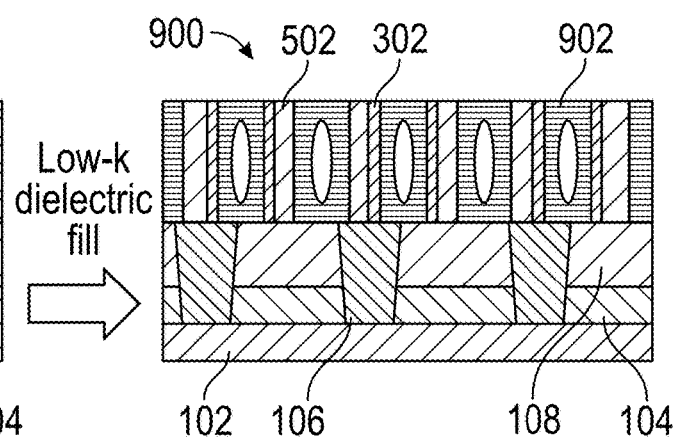

Optionally, at 214, form a structure 900 by filling the voids with dielectric 902, as shown in FIG. 9. In one or more embodiments, a low-k dielectric is used.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

Those skilled in the art use various techniques to remove material while creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Low-k dielectrics, in context of this disclosure, include silicon oxides, silicon nitrides, titanium oxides, titanium nitrides, aluminum oxides, aluminum nitrides, and other materials with similar electrical properties.

Various materials herein are referred to as being epitaxially grown. "Epitaxy" or "epitaxial growth," as used herein, refers to a process by which a layer of single-crystal or large-grain polycrystalline material is formed on an existing material with similar crystalline properties. One feature of epitaxy is that this process causes the crystallographic structure of the existing substrate or seed layer (including any defects therein) to be reproduced in the epitaxially grown material. Epitaxial growth can include heteroepitaxy (i.e., growing a material with a different composition from its underlying layer) or homoepitaxy (i.e., growing a material which includes the same composition as its underlying layer). Heteroepitaxy can introduce strain in the epitaxially grown material, as its crystal structure may be distorted to match that of the underlying layer. In certain applications, such strain may be desirable. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Given the discussion thus far, it will be appreciated that, in general terms, an exemplary structure 500, according to an aspect of the invention, includes a semiconductor substrate 102; a metal via 106 in the substrate; and, on the substrate, a metal line 502 that is less than 8 nanometers (nm) wide and at least 20 nm tall.

In one or more embodiments, the structure does not exhibit line bridges, breaks, and/or flop overs.

In one or more embodiments, the line has at least one side surface with less than 1 nm roughness.

In one or more embodiments, the metal line 502 includes a main body of a first metal; and, at one side surface of the main body, a liner 302 of a different metal-containing material; the liner is less than 3 nm thick. In one or more embodiments, the main body has a side surface, opposite the liner, with less than 1 nm roughness. In one or more embodiments, the metal-containing material is selected from the group consisting of: titanium nitrides, tantalum nitrides, and ruthenium. In one or more embodiments, the first metal is selected from the group consisting of: ruthenium, cobalt, and tungsten.

In one or more embodiments, the structure also includes, on the substrate, a semiconductor mandrel directly contacting a side surface of the line. In one or more embodiments, the line comprises a portion overlying the mandrel.

In one or more embodiments, the structure also includes a body of dielectric atop the via and contacting the line.

According to another aspect, an exemplary method for making a semiconductor structure includes forming a metal via in a substrate; forming a mandrel atop and offset from the via; depositing a metal-containing liner onto the mandrel; exposing the top of the mandrel by anisotropically etching the liner, thereby defining a separate portion of the liner at each side of the mandrel; and growing a metal line on each portion of the liner.

In one or more embodiments, the method also includes forming multiple mandrels, liners, and lines, then filling a dielectric material between the lines at opposing sides of adjacent mandrels.

In one or more embodiments, the mandrel includes a semiconductor, and the method includes replacing the mandrel with additional dielectric material.

In one or more embodiments, the method includes depositing the liner by atomic layer deposition. In one or more embodiments, the liner is deposited to no more than 3 nm thickness.

In one or more embodiments, the method includes growing the line by selective deposition. In one or more embodiments, the line is grown to no more than 8 nm thickness. In one or more embodiments, the line is grown to a surface roughness less than 1 nm.

In one or more embodiments, the liner comprises at least one of titanium, tantalum, tungsten, and ruthenium. In one or more embodiments, the line comprises at least one of ruthenium, cobalt, and tungsten.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for making a semiconductor structure, the method comprising:
    forming a metal via in a substrate;
    forming a mandrel in contact with a top surface of the via and offset from the via;
    depositing a metal-containing liner onto the mandrel;
    exposing a top portion of the mandrel by anisotropically etching the liner, thereby defining a separate portion of the liner at each side of the mandrel; and
    growing a metal line on each portion of the liner.

2. The method of claim 1, further comprising forming the mandrel to a height of at least 20 nm.

3. The method of claim 2, further comprising forming multiple mandrels, liners, and lines, then filling a dielectric material between the lines at opposing sides of adjacent mandrels.

4. The method of claim 3, wherein the mandrel comprises a semiconductor, further comprising replacing the mandrel with additional dielectric material.

5. The method of claim 2, further comprising depositing the liner by atomic layer deposition.

6. The method of claim 2, wherein the liner is deposited to no more than 3 nm thickness.

7. The method of claim 2, further comprising growing the line by selective deposition.

8. The method of claim 2, wherein the line is grown to no more than 8 nm thickness.

9. The method of claim 8, wherein the line is grown to a surface roughness less than 1 nm.

10. The method of claim 2, wherein the liner comprises at least one of titanium, tantalum, tungsten, and ruthenium.

11. The method of claim 10, wherein the line comprises at least one of ruthenium, cobalt, and tungsten.

12. The method of claim 11, wherein the line comprises cobalt.

13. The method of claim 11, wherein the line comprises ruthenium.

14. The method of claim 10, wherein the liner comprises ruthenium.

15. The method of claim 4, wherein the additional dielectric is atop and in contact with a portion of the via and wherein the additional dielectric comprises a void.

16. The method of claim 4, wherein the additional dielectric comprises a low-k material.

17. The method of claim 4, wherein the additional dielectric is co-planar with the liner and the line.

18. The method of claim 1, wherein the mandrel comprises a dielectric material.

19. The method of claim 1, wherein a combined width of the line and the liner is less than the width of the via.

20. The method of claim 1, wherein a combined width of the line and the liner is less than 8 nanometers (nm), with less than 1 nm line width roughness; and
    wherein depositing the metal-containing liner is by atomic layer deposition.

* * * * *